(12) United States Patent
Agrawal

(10) Patent No.: US 6,341,092 B1
(45) Date of Patent: Jan. 22, 2002

(54) DESIGNING MEMORY FOR TESTABILITY TO SUPPORT SCAN CAPABILITY IN AN ASIC DESIGN

(75) Inventor: Ghasi R. Agrawal, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/735,233

(22) Filed: Dec. 11, 2000

(51) Int. Cl.[7] ............................................... G01R 31/28
(52) U.S. Cl. ........................................ 365/201; 714/726
(58) Field of Search ............................ 365/201; 714/30, 714/726, 727, 724; 712/220, 223, 235

(56) References Cited

U.S. PATENT DOCUMENTS 5,774,473 A * 6/1998 Harley ......................... 714/30
6,286,199 B1 * 9/2001 Wu et al. .................... 714/726

* cited by examiner

Primary Examiner—Vu A. Le

(57) ABSTRACT

A system and method are presented for incorporating boundary scan test capability in an embedded memory. Existing half-latches within the memory are augmented to create full-latches, configurable as a scan register. This requires substantially less circuitry than if the entire scan register was created separately. Furthermore, separate signal paths are maintained for the functional signals and for the boundary scan data. Therefore, the boundary scan logic does not contribute additional propagation delay to the functional signals. Also, because the test circuitry is within the memory (rather than external to it), placing and routing of the scan circuitry is much less complicated than with previous methods.

23 Claims, 8 Drawing Sheets

DESIGNING MEMORY FOR TESTABILITY TO SUPPORT SCAN CAPABILITY IN AN ASIC DESIGN

BACKGROUND OF THE INVENTION

1. Field of Invention

This invention relates to semiconductor memory and, more particularly, to test and repair of semiconductor memory.

2. Description of Related Art

Testing an integrated circuit can be performed in various ways. For example, the integrated circuit can be tested while in wafer form using test probe operation. additionally, or alternatively, the integrated circuit can be tested after it is scribed and packaged. In either instance, sequential and/or combinatorial logic of the integrated circuit must be tested using input test data, generally referred to as "test vectors." Test vectors are supplied from a commercial test machine or Automated Test Equipment ("ATE"). Alternatively, the test vectors can be provided from circuitry upon the integrated circuit. Such circuitry is often referred to as built in self test ("BIST") circuitry. BIST circuitry may use a pseudo-random sequence generator to produce test vectors forwarded to the functional core logic of the integrated circuit.

As semiconductor technology has advanced, making possible higher levels of integration, device testability has become increasingly problematic. Semiconductor manufacturers have resorted to higher pin counts and smaller pin separations on device packages, in order to accommodate very highly integrated circuits. It is no longer feasible in some cases to probe these integrated circuits externally, because of the minute physical dimensions of the package leads. Furthermore, device operating speeds have also increased to the point where loading and introduction of noise by external probes has become an important consideration.

A further disadvantage to the use of conventional external device testers arises when the memory under test is "embedded"—i.e., the memory is a component within a more complex integrated circuit. The embedded memory is often present in the form of on-chip RAM within an application specific integrated circuit (ASIC). Frequently, there is intervening circuitry between the memory device and the input/output (I/O) pins on the device package. In such cases, many of the memory signal ports are not externally accessible. The device tester is then incapable of probing the memory directly.

Traditional methods of testing rely on external test equipment, such as oscilloscopes and logic analyzers. Often, huge numbers of test cases must be evaluated to fully validate a sophisticated integrated device, and the amount of time required for a human tester to administer a full suite of tests becomes prohibitive. Automated Test Equipment (ATE) can often be employed to test such complex devices, but is expensive and time-consuming to set up. Therefore, the use of automated testers is largely limited to the production environment. Furthermore, for many high-performance integrated circuits, even an automated tester may not be feasible. For instance, some processors operate at such high clock rates that it is virtually impossible to maintain the integrity of data and control signals over the distance separating the IC and the tester. For these, and other reasons, much of the test functionality has been moved into the integrated circuit itself.

An important development that has arisen out of the need to test ever more complex integrated circuits, is the introduction of boundary scan test capability. Boundary scan testing requires the inclusion of diagnostic circuitry with the core logic of the device under test. Among this diagnostic circuitry is a boundary scan register, which functions analogously to a parallel-in/parallel-out shift register. The scan register is capable of applying diagnostic bit patterns ("test vectors") to the inputs of the core logic, and capturing the resulting state of core logic outputs. The boundary scan test circuitry may share the same die as the integrated circuit itself. Alternatively, the test circuitry may be on a different die, but within the same package as the circuit itself. With the test circuitry in such close proximity, the difficulty in monitoring and controlling high-speed signals is reduced. A simplified external tester communicates with the boundary scan test circuitry, and has only to initiate tests and collect the results.

Boundary scan test techniques have been successfully applied in semiconductor memory devices. However, the conventional approach requires adding significant test circuitry to the memory device, as well as additional I/O pins on the device package dedicated to test functions. When the memory is embedded, the addition of the boundary scan test circuitry may be problematic. In the first place, the test circuitry may require considerable additional area on the semiconductor die, leading to placement and routing difficulties. Furthermore, since the exact location of the test circuit elements and the associated signal path lengths cannot generally be known in advance, the timing characteristics of the scan-enabled memory are not readily predictable. To ensure adequate performance and reliability, a rigorous reevaluation of the timing parameters for the embedded memory device may be required.

It would be desirable to incorporate boundary scan test circuitry into an embedded memory device, while avoiding the disadvantages described above. Preferably, a minimum of additional circuitry would be required, and its inclusion would not influence the timing parameters of the memory device itself. Ideally, the boundary scan test circuitry could be used with various types of embedded memory—e.g., SRAM, CAM, etc. It would be of further advantage if the interface did not require the addition of a large number of device pins to the integrated circuit package.

SUMMARY OF THE INVENTION

Testing of embedded semiconductor memory devices is made difficult by the fact that many of the device signal ports are not externally accessible. Therefore, testing is often accomplished using boundary scan circuitry, incorporated on the same semiconductor die as the memory. However, the inclusion of such circuitry has some drawbacks. In the first place, the boundary scan test circuitry can occupy considerable additional die area. This may make layout and routing of the integrated circuit much more difficult. Furthermore, if the boundary scan components are inserted into the signal paths of the memory device they will influence critical timing parameters, and may degrade device performance.

Disclosed herein is a system for providing scan testability in an embedded memory device, which overcomes the above problems. In an embodiment of the system disclosed herein, complementary half-latches are added to already-existing half-latches at the signal inputs of the embedded memory device. Each pair of half-latches operates as a full-latch. Dual-input multiplexers at the input of each full-latch select between the nominal signal and a scan test signal, which is the output of the previous full-latch. This allows the full-latches to be connected in parallel or in series. The parallel configuration corresponds to functional (i.e., normal) operation of the memory, while the series configuration supports scan testing of the memory and associated circuitry. A scan control signal programs the multiplexers to select between the functional and the test configuration.

Advantageously, the system disclosed herein isolates the normal signal path from the scan path during normal operation. Accordingly, each functional input signal (e.g., address, data) traverses only the already-existing half-latch, and not the complementary one as well. This avoids the increased propagation time that would result from having the signal pass through two latches. A further advantage results from the fact that the additional logic required for scan testability resides within the memory device itself. This reduces the difficulty for the memory designer of placing and routing the scan circuitry. The system disclosed herein is believed to be applicable to embedded memory devices of various types, such as static dynamic random access memory (SRAM) or content addressable memory (CAM).

A method for incorporating scan testability in an embedded memory is also disclosed herein. According to this method, the memory supports operation in either functional or test mode, and a pair of half-latches is associated with each of the functional input signals directed to the memory. In the functional mode, the primary half-latch in each pair of half-latches captures a respective bit from the input signal, and drives the stored value upon a corresponding functional signal line within the memory. In the test mode, the pairs of primary and secondary half-latches are connected in series, such that the output of the secondary half-latch in a given pair conveys its stored value to the input of the primary half-latch of the next pair. Thus, the scan input signal presented to the input of the primary half-latch in the first pair propagates through all the pairs, in the manner of a shift register, emerging as a scan output signal from the final pair. A scan control signal is used to configure the half-latches for functional or test mode operation.

BRIEF DESCRIPTION OF THE DRAWINGS

Other objects and advantages of the invention will become apparent upon reading the following detailed description and upon reference to the accompanying drawings in which.

Figure 1A:
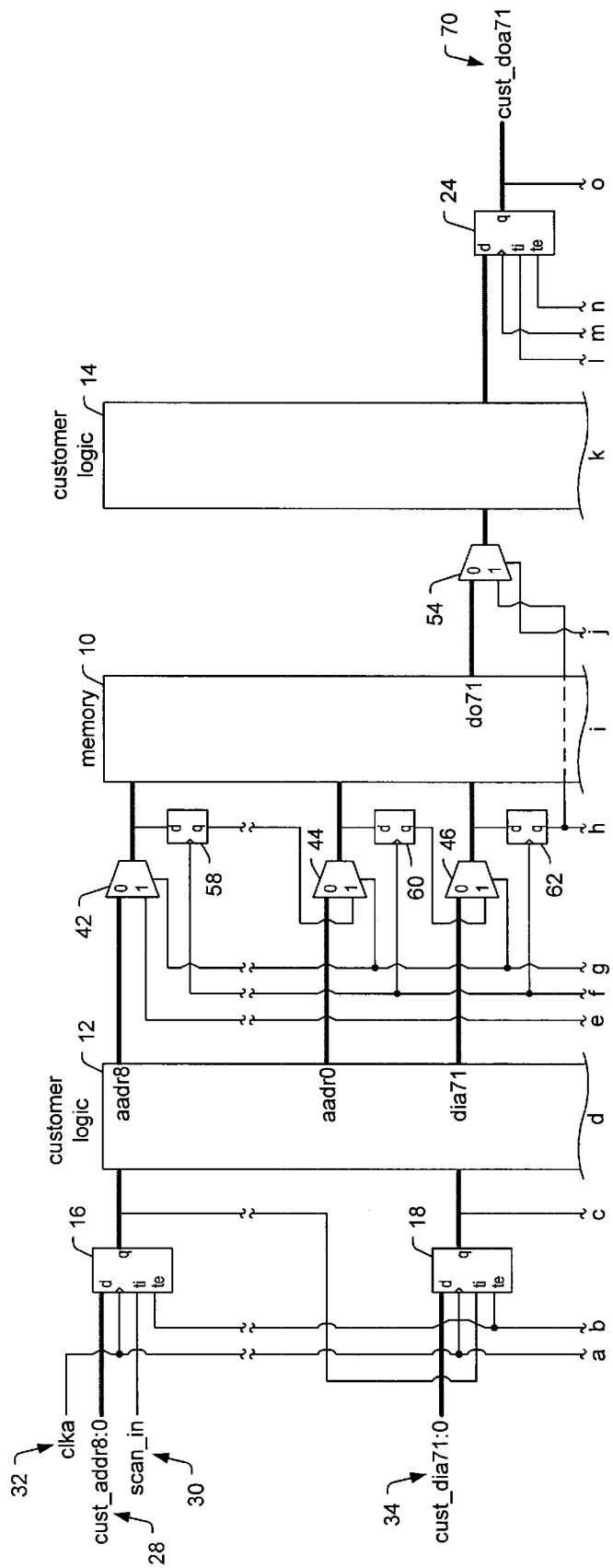
FIGS. 1a and 1b show the signal paths during normal operation and during boundary scan testing, for a memory device to which external scan logic has been added.
Figure 1A:
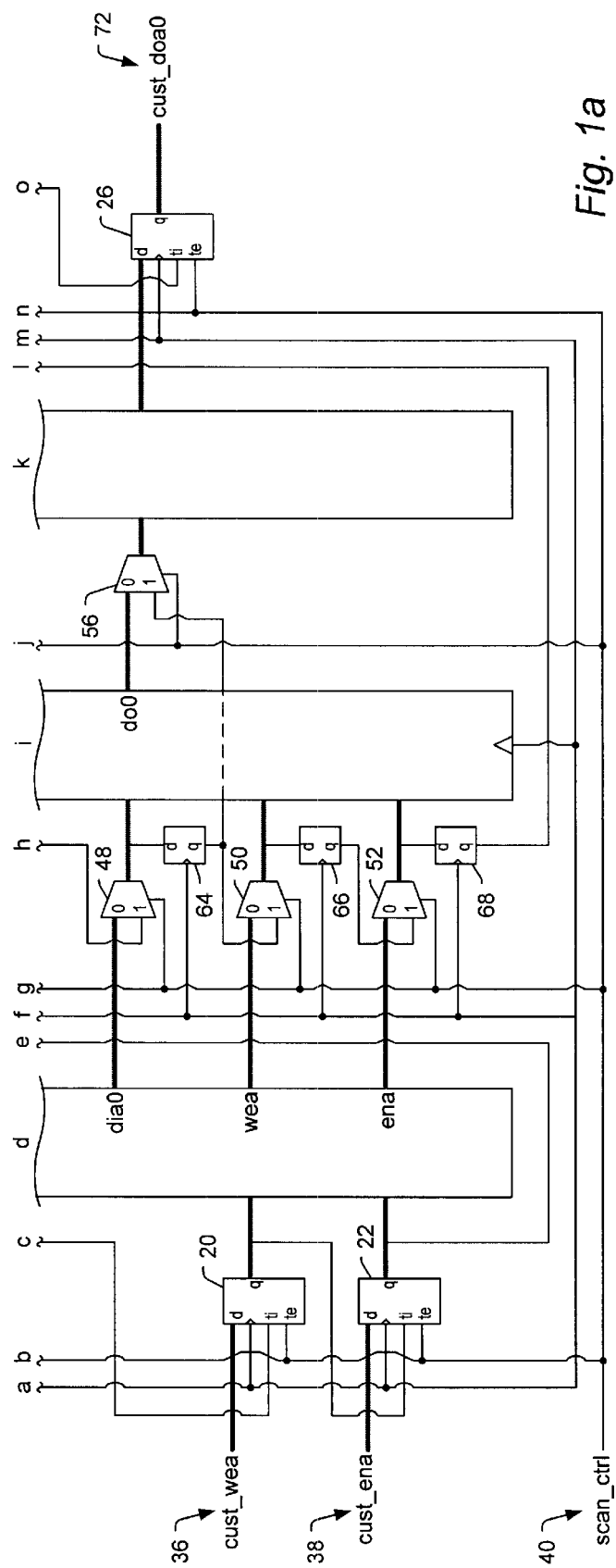

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Semiconductor memory devices are often included among the on-chip resources within more complex integrated circuits. For example, in modern microcontrollers, the processor is generally integrated with supporting circuitry, including program and data memory, and various ancillary devices (e.g., timers, serial ports, etc.). A semiconductor memory device, as discussed herein, is comprised of a matrix of storage locations, along with the associated logic to address specific storage locations, and to write/read data to/from those locations. A memory device that is incorporated with other functions and circuitry in an integrated circuit is said to be "embedded". Memory is an important component of many application specific integrated circuits (ASICs). ASICs are custom integrated circuits, specifically designed for some particular application. Such "made-to order" devices are typically synthesized from libraries of standard components, using software that allows the designer to simulate the actual device before it is fabricated. For example, worst-case propagation times along the various signal paths within the ASIC can be predicted, using the models in the device libraries along with known characteristics of the semiconductor process being used.

The incorporation of boundary scan circuitry in an embedded memory complicates the task of the ASIC designer, however. In the first place, the scan logic (primarily consisting of multiplexers and flip-flops) requires considerable additional space on the semiconductor die. If the majority of the available die area is already allocated, considerable effort may be required to place and route these components. Furthermore, when the gates and flip-flops comprising the scan logic are inserted into the signal paths of the embedded memory, propagation delays and timing characteristics are altered. In such cases, it may be difficult to predict worst-case timing performance of the embedded memory, making reliable operation harder to verify.

Figure 1B:
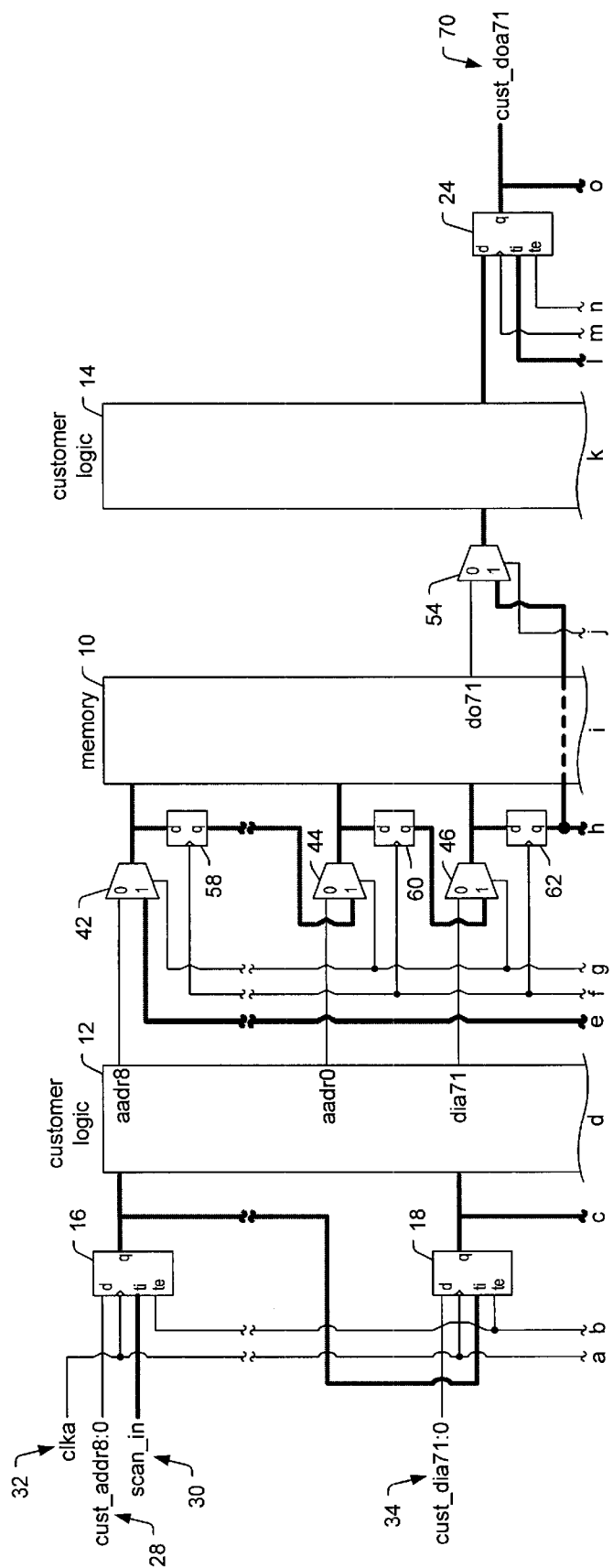
Figure 1B:
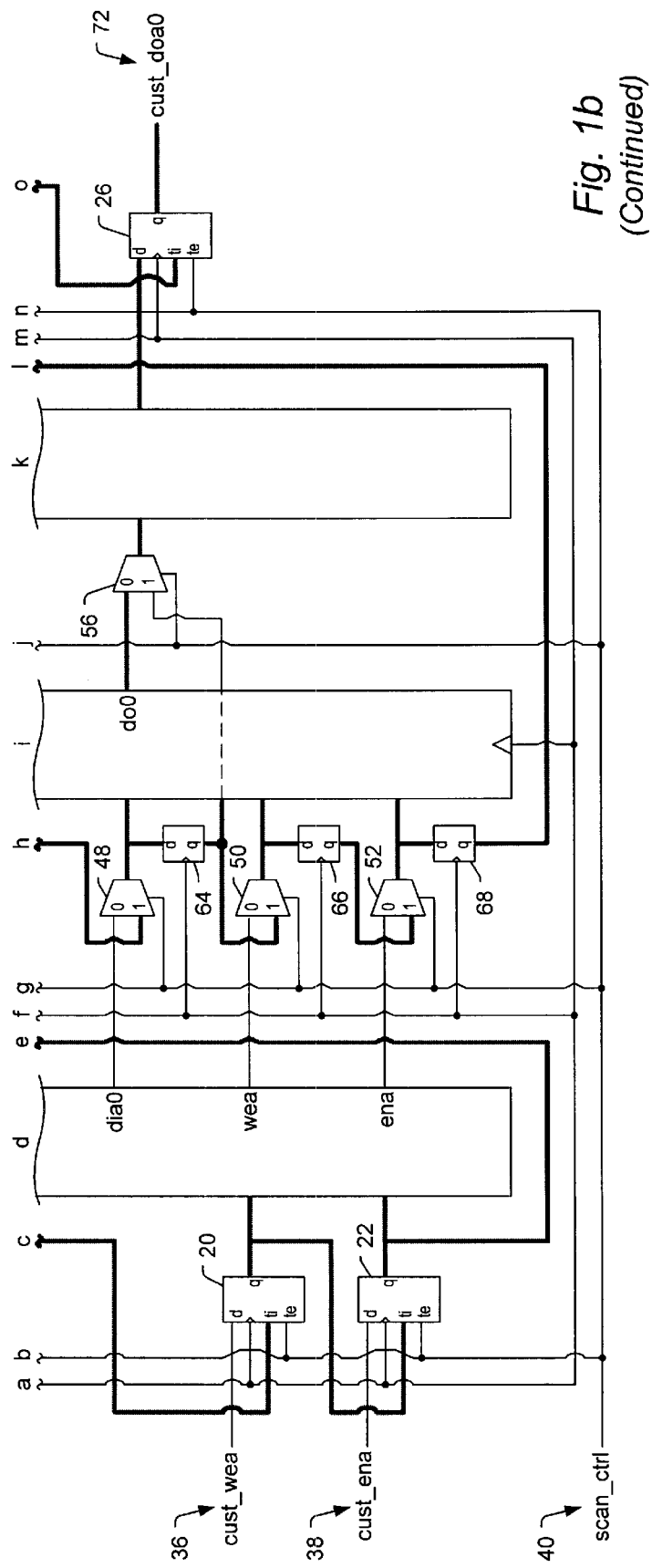

An example illustrating the conventional approach for the inclusion of boundary scan logic in an embedded memory device is given in FIGS. 1a and 1b. In FIG. 1a, the embedded memory 10 is shown between input customer logic 12 and output customer logic 14, and has 72 data inputs and outputs. The scan_ctrl signal 40 configures the signal paths for either normal or test-mode operation. This is done using the control pin on flip-flops 16–26 and the select input on multiplexers 42–56. FIG. 1a illustrates the normal mode of operation, which occurs when scan_ctrl is LOW. The signal path for this mode is indicated by the heavy line. In this case, flip-flops 16–26 select the signal at their respective d inputs, and multiplexers 42–56 select the signal at their respective 0 inputs. When signal paths for normal operation are selected, input flip-flops 16–22 receive the address and data signals cust_addr8:0 28 and cust_dia71:0 34, along with enable signals cust_wea 36 and cust_ena 38. (For simplicity, only one of the flip-flops corresponding to cust_addr8 . . . cust_addr0 is shown, and only one of the flip-flops corresponding to cust_dia71 . . . cust_dia0 is shown.) The normal path for these input signals is through the customer logic 12 into multiplexers 42–52. With scan_ctrl LOW, address signals aadr8–aadr0 pass from the customer logic 12 through multiplexers 42–44, and into the embedded memory 10. Likewise, data input signals dia71–dia0 pass through multiplexers 46–48, and enable signals wea and ena through multiplexers 50 and 52. (For simplicity, address signals aadr7–aadr1, data input signals dia70–dia1, and their respective multiplexers are not shown.) In the same manner, the embedded memory data outputs, do71–do0, pass through multiplexers 54 and 56 into customer output logic 14, and then into flip-flops 24 and 26. These signals then appear as cust_doa71–cust_doa0 at the outputs of flip-flops 24 and 26. (For simplicity, signals do70–do1 and respective multiplexers, and signals cust_do70–cust_do1 and respective flip-flops are not shown.)

Boundary scan test-mode operation is entered when scan_ctrl goes HIGH. As mentioned earlier, the boundary scan register functions analogously to a parallel-in/parallel-out shift register. The individual stages of the register are often referred to as "scan cells" and the signal path through the boundary scan register as the "scan path." A scan cell is associated with each of the inputs and outputs of the internal circuitry. During normal operation, the scan cells have no effect on the circuitry, other than to add a small propagation delay. But during test, the scan cells can be made to override the inputs of the internal circuitry, forcing them to some desired initial state. The scan cells can also latch the outputs of the internal circuitry, thereby capturing the output state. Test data are read into or out of the scan register serially. A multi-bit test signal (i.e., a test vector) is clocked into the scan register one bit at a time, propagating through the scan cells at each clock transition. Once the entire test vector has been read into the scan register, all the scan cells simultaneously transfer their contents into the internal circuitry (i.e., the circuitry being tested). This process is reversed to scan data out of the internal circuitry—i.e., the scan cells simultaneously capture the logic state of associated internal signals, and their contents are then clocked out serially. Thus, the scan register enables input/output testing of the embedded memory, as well as the input and output customer logic.

When scan_ctrl is HIGH, test-mode operation is selected, as shown in FIG. 1b. The signal path (indicated by the heavy line) is now through the boundary scan components. In FIG. 1b, the test signal enters the scan path at the scan_in input 30 of flip-flop 16. Because scan_ctrl is HIGH, the ti input of flip-flop 16 is selected, rather than the d input. From this point, the scan path continues to flip-flops 18, 20, and 22. The scan path then proceeds from the output of flip-flop 22 to the 1 input of multiplexer 42 and then to the D flip-flop 58, both of which are associated with aadr8. The test signal then propagates through corresponding components for aadr7–aadr0 (components for aadr7–aadr1 are not shown) to the first of 72 multiplexers 46 and D flip-flops 62 for data signals, dia71–dia0 (components for dia70-dia1 are not shown). In addition to proceeding to the next multiplexer, the scan path (heavy dashed line) from D flip-flop 62 goes directly to the first of 72 multiplexers 54 on the output side of the embedded memory (multiplexers for do70–do1 are not shown). An analogous arrangement exists with the corresponding components for dia70–dia0. This scan path bypasses the memory 10 to permit direct entry of test data into the output customer logic 14. The other branch of the scan path from flip-flop 62 goes to the series-connected flip-flops corresponding to dia70–dia0, leading ultimately to multiplexer 52 and flip-flop 68, which are associated with ena from the input customer logic 12. The output of flip-flop 68 is connected to the ti input of flip-flop 24, the first of the series-connected flip-flops associated with the data outputs cust_doa71 . . . cust_doa0. In both normal and test modes, all logic is synchronized by a clock signal 32.

From this example, it will be appreciated that significant additional logic is required to implement boundary scan test capability in the embedded memory. The resultant cost in terms of die area, as well as the effort required for placement and routing of the ASIC, may offset the benefit of improved testability. Moreover, it is generally the case that the exact placement and routing of the scan logic components cannot be known ahead of time. Therefore, including these components in various signal paths can have an unpredictable effect on the associated propagation delay. Consequently, validation of the scan-enabled embedded memory may require a complete reevaluation of the ASIC timing characteristics.

The system and method disclosed herein exploit an inherent architectural feature of the embedded memory to provide boundary scan testability, while avoiding the drawbacks associated with the conventional approach described above. Generally, the memory devices used in ASIC fabrication contain a half-latch at each of the functional inputs to the memory. The term "half-latch" generally refers to a logic element with a data input and a control input, along with a data output. When the control input is in one logic state, the output of the half-latch follows its input (i.e., the output is HIGH when the input is HIGH, and LOW when the input is LOW). During this time, the half-latch is said to be "transparent". When the control input switches to the complementary state, the output of the half-latch ceases to follow the input, but instead, holds (or "latches") whatever logic level was present at the input just before the control input changed state.

Figure 2:
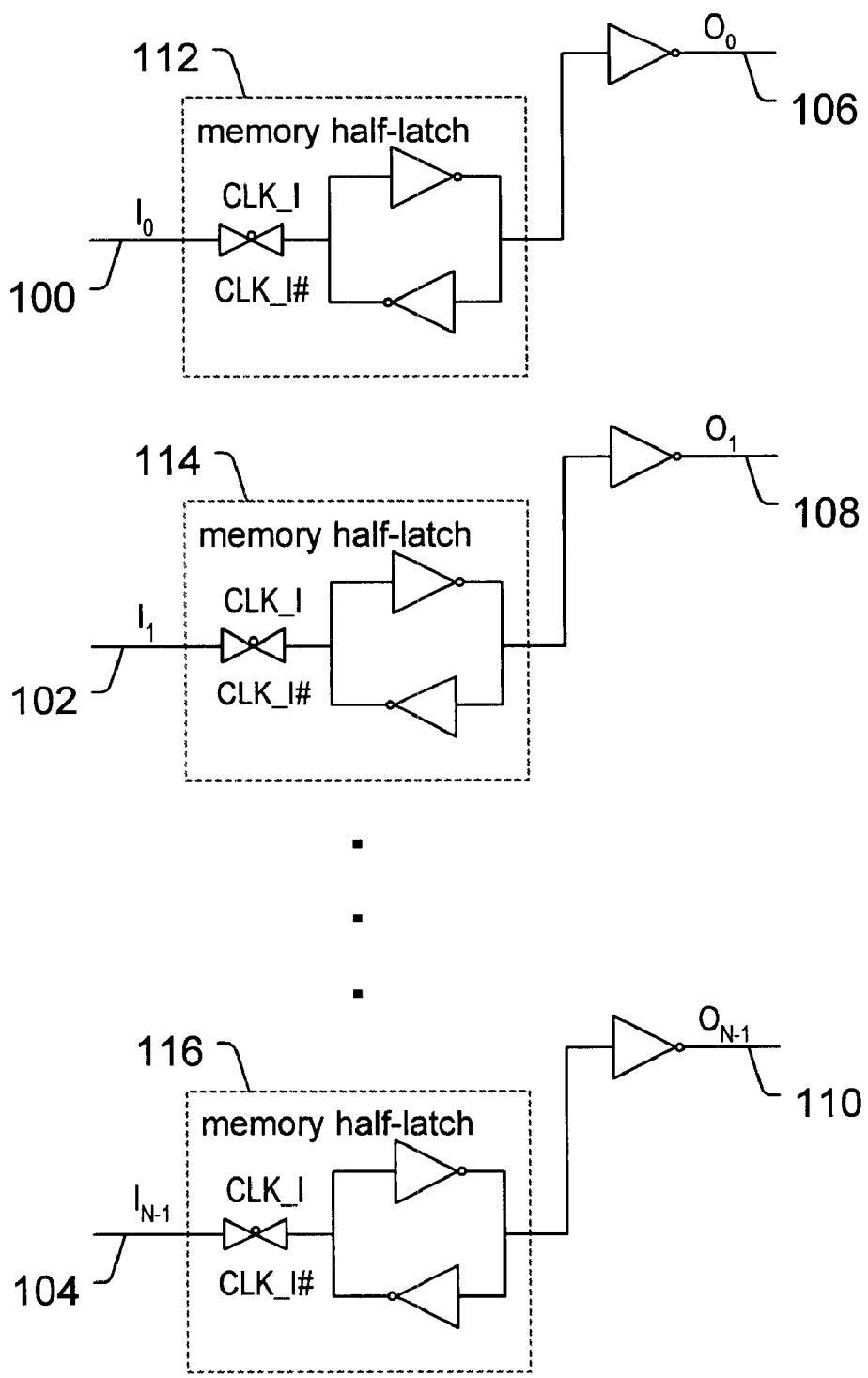
FIG. 2 illustrates half-latches normally present within a memory.

FIG. 2 illustrates the use of half-latches in the memory input signal lines, as described above. In this example, input signals $I_0$ 100, $I_1$ 102, and $I_{N-1}$ 104, enter half-latches 112, 114 and 116, respectively. The buffered output of each latch ($O_0$ 106, $O_1$ 108 and $O_{N-1}$ 110) comprises one of the internal signal lines used to select memory locations, read/write data, etc. Complementary clock signals (CLK_I and CLK_I#), control the transparency of the half-latches. When CLK_I is LOW, each latch is transparent—i.e., it passes its incoming signal through to its output. When CLK_I goes HIGH, the latches lose their transparency and hold their current state.

Since these half-latches are already present in the memory, it would be beneficial if they could be incorporated into the boundary scan circuitry. Fewer additional components would then be needed to create a scan register. Unfortunately, this is not possible, due to the fact that the scan cells require a full-latch. In contrast to the half-latch, a full-latch captures the state of the input when the control input changes state—e.g., on the rising edge of a transition from LOW to HIGH. Thus, the full-latch is never "transparent", since there is no situation in which the output follows the input.

Figure 3:
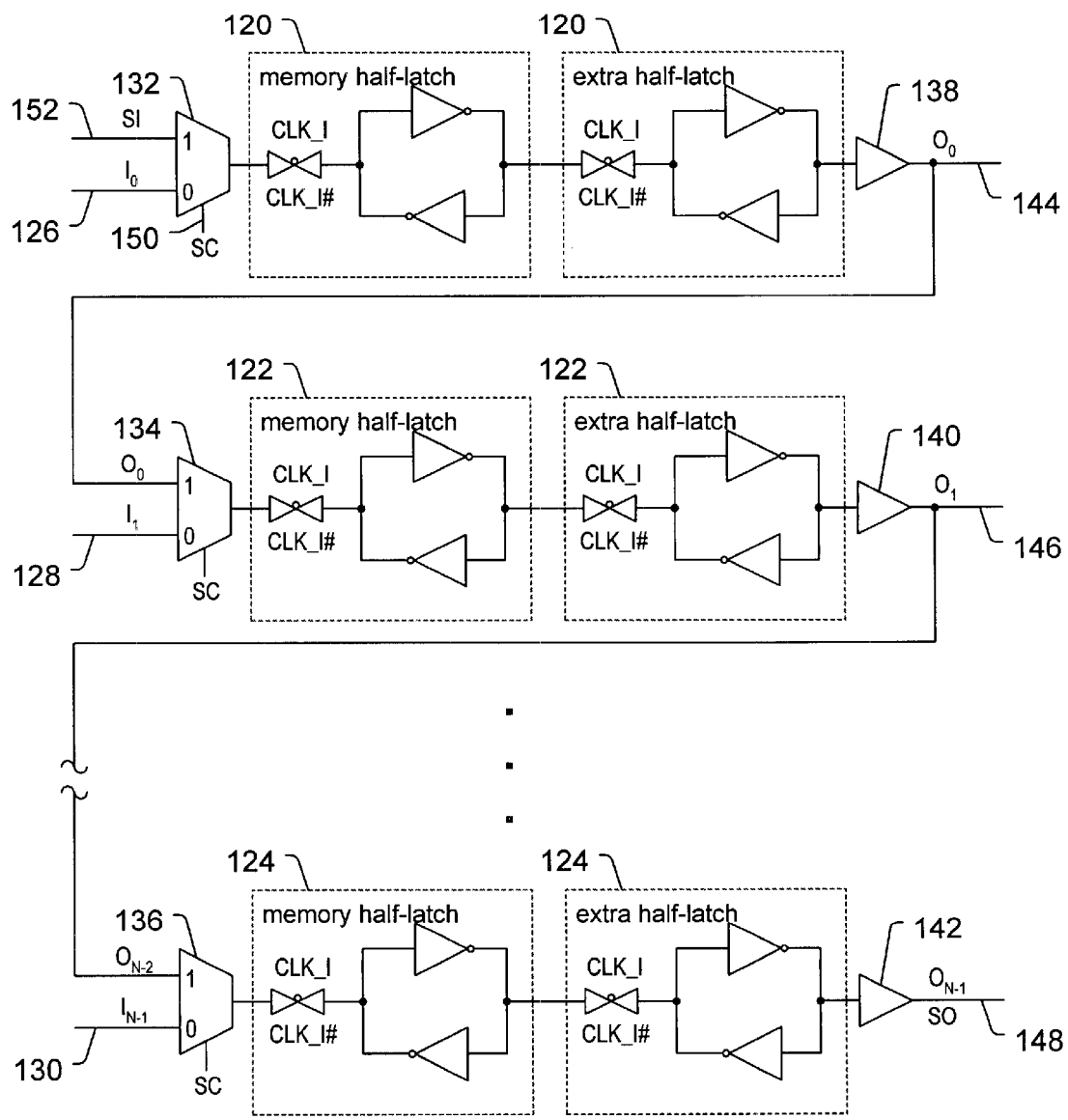
FIG. 3 illustrates the direct conversion of the existing half-latches to full-latches, suitable for use as scan cells.

However, a full-latch can be fabricated from a pair of series-connected half-latches. Thus, the presently existing half-latches could easily be transformed into full-latches and, with the addition of multiplexers, the majority of the scan logic could be placed within the embedded memory. This option is illustrated in FIG. 3, wherein each of the existing half-latches has been complemented by an extra half-latch to form full-latches 120, 122, and 124. The input signals $I_0$ 126, $I_1$ 128, and $I_{N-1}$ 130, are received at the 0 input of multiplexers 132, 134, and 136. After being clocked through the corresponding full-latches, 120–124, these signals are buffered by gates 138, 140, and 142, to appear as latched output signals $O_0$ 144, $O_1$ 146, and $O_{N-1}$ 148, respectively. As discussed in connection with FIG. 2, $O_0$ . . . $O_{N-1}$ are the internal signal lines of the memory device. The full-latches are also connected in series, by coupling the $n^{th}$ buffered output to the multiplexer for the n+1$^{th}$ input signal. For example, output $O_0$ 144 is coupled to the 1 input of multiplexer 134, which corresponds to input signal $I_1$ 128. This establishes the necessary serial connection to configure the full-latches within the memory as a scan register. During normal operation, scan control signal SC 150 is LOW, causing multiplexers 132–136 to couple the signals $I_0$–$I_{N-1}$ to the respective full-latch 120–124, then to buffer stages 138–142, and finally to drive the internal signal lines of the memory 144–148. (Note that scan control signal SC 150 in FIG. 3 serves the same function as scan_ctrl signal 40 in FIGS. 1a and 1b.) During test-mode operation, SC 150 goes HIGH, causing each multiplexer to select its 1 input. In this case, the first multiplexer 132 couples the scan input signal SI 152 to full-latch 120, then to buffer 138. (Scan input signal SI 152 in FIG. 3 serves the same function as scan_in 30 in FIGS. 1a and 1b.) This signal is fed to the 1 input of the next multiplexer 134, which couples it to respective full-latch 122, and buffer 140. In a similar manner, the scan signal propagates to the last multiplexer 136, through full-latch 124, and out of buffer 142 to appear as scan output signal SO 148. From this point, the scan output signal would be directed to subsequent scan logic within the ASIC, and ultimately to the scan output pin of the integrated circuit.

By incorporating the existing half-latches in the embedded memory, less additional logic is required for implementation of boundary scan test capability, as compared with the conventional approach illustrated in FIGS. 1a and 1b. However, there is a disadvantage to this scheme. In the normal mode of operation, each input signal $I_i$ must pass through an additional half-latch before appearing on internal signal line $O_i$. This contributes to the propagation delay of the signal, and may impair the performance and reliability of the memory device. Furthermore, the use of full-latches makes the input logic edge sensitive rather than level sensitive, substantially altering the functionality of the memory. However, these effects can be avoided by separating the scan path from the normal signal path, according to the system and method disclosed herein. An embodiment of this system and method is shown in FIG. 4.

Figure 4:
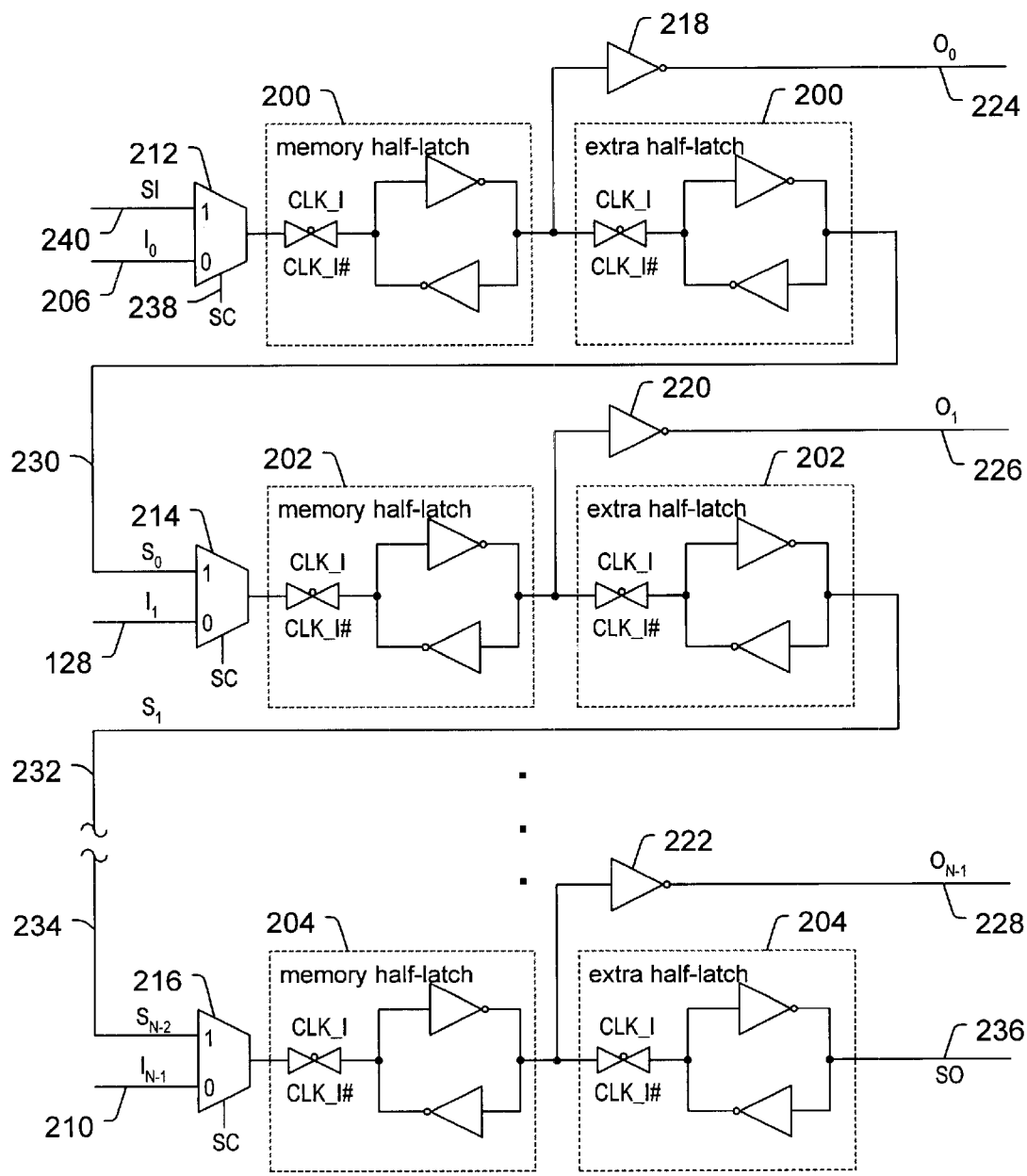
FIG. 4 illustrates the conversion of existing half-latches to full-latches, according to the system and method disclosed herein, by virtue of which, the input signals bypass the scan path.

The circuitry of FIG. 4 is similar to that of FIG. 3. As before, the existing half-latches in the embedded memory are complemented with extra half-latches to form full-latches 200, 202, and 204. The input signals $I_0$ 206, $I_1$ 208, and $I_{N-1}$ 210, are coupled to the 0 inputs of multiplexers 212, 214, and 216. In contrast to the previous case, however, the signal from each memory half-latch follows two distinct paths. The first path is into buffers 218, 220, and 222, which drive internal signal lines $O_0$ 224, $O_1$ 226, and $O_{N-1}$ 228. For this path, the second half-latch does not contribute to the propagation delay of the associated signal. The second path is through the extra half-latch. This gives rise to scanned signals $S_0$ 230, $S_1$ 232, and $S_{N-2}$ 234, which connect the full-latches in series to implement the scan register, as well as SO 236, which would be directed to subsequent scan logic within the ASIC, and ultimately to the scan output pin of the integrated circuit. As discussed above, the scan register permits input/output testing of the embedded memory along, with the input and output customer logic which interfaces to it.

Figure 5:
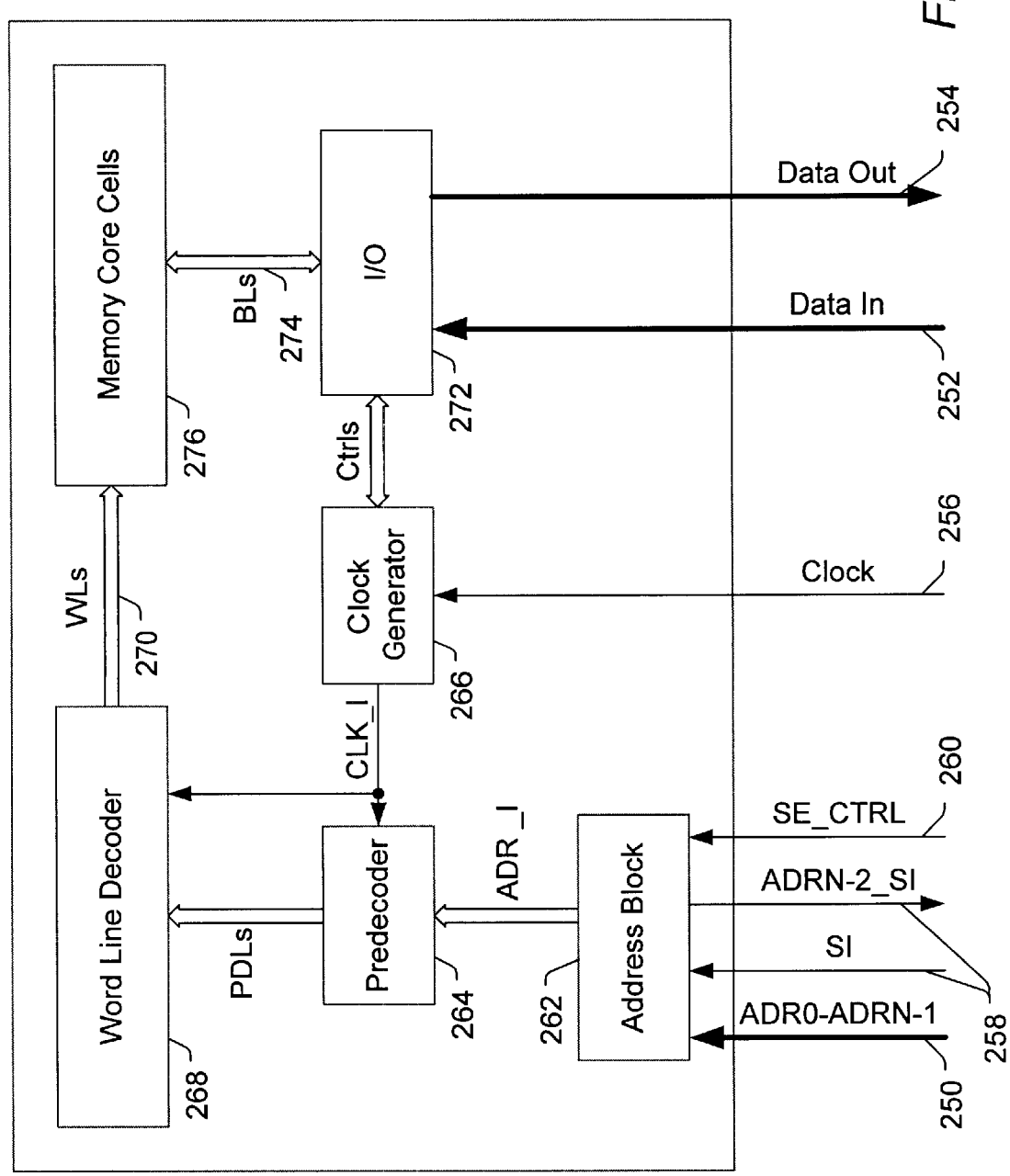
FIG. 5 shows the organization of a memory device, according to the system and methods disclosed herein.

An exemplary embodiment of a memory device incorporating the scan path logic described above is presented in FIG. 5. This configuration is typical of an embedded memory device. The scan test components are not visible in FIG. 5, since they are incorporated into the memory itself. If the memory device is embedded, address 250 and data input 252 and output 254 lines enter the memory from peripheral circuitry within the integrated circuit, and are generally not externally accessible. As mentioned earlier, this precludes direct probing of the embedded memory by an external tester. Along with memory address lines 250, scan input and output lines 258, and scan control line 260 are received by address block 262. The half-latches generally present in memory devices, which capture the state of address lines 250 (as well as other functional inputs to the memory), are located in address block 262. This is also where the additional half-latches and multiplexers of the system and method disclosed herein are placed. The address outputs from address block 262 are coupled to the Predecoder 264. An external clock signal 256 is distributed to the Predecoder 264 and Word Line Decoder 268 by Clock Generator 266. Word Line Decoder 268 generates wordlines 270 to select words, or groups of words within the memory array 276. The data input 252 and output 254 lines are buffered by the I/O block 272, and transformed into bitlines 274, which transfer data bits to or from the individual memory locations selected by the wordlines.

The system and method disclosed herein provide a means of incorporating boundary scan test capability in an embedded memory by complementing circuitry already present within the memory. This reduces the need for additional logic and requires less of the ASIC die area. Furthermore, since the scan logic is present within the memory, the memory designer can account for the timing of all signals paths in advance. Moreover, according to the present system and method, the scan path and the functional signal path are separate. Thus, the propagation delay associated with the additional boundary scan circuitry does not degrade normal signal propagation.

It will be appreciated by those skilled in the art having the benefit of this disclosure that this invention is believed to present a system and method for design of an embedded memory supporting boundary scan testability. Further modifications and alternative embodiments of various aspects of the invention will be apparent to those skilled in the art in view of this description. It should be obvious that the system and methods disclosed herein may be applied to any of the functional inputs to the memory device, including address, data and control signals. Such details as the number of signals, multiplexer configuration, etc. described herein are exemplary of a particular embodiment. It is anticipated that the benefits arising from the use of the system and method described herein may apply to various types of memory devices and technologies, including static random access memory (SRAM), content addressable memory (CAM), etc. It is intended that the following claims be interpreted to embrace all such modifications and changes and, accordingly, the specification and drawings are to be regarded in an illustrative rather than a restrictive sense.

What is claimed is:

1. A memory device, comprising:

an array of storage locations;

a scan input test vector; and a plurality of series-connected scan cells, wherein an initial one of the plurality of scan cells is adapted to receive the scan test vector and each of the scan cells is adapted to receive a respective one of a plurality of input signals, such that the respective input signals are forwarded through only a portion of the corresponding said plurality of scan cells to a corresponding one of the storage locations and, during a test mode of operation, the scan test vector is forwarded through an entirety of each of the plurality of scan cells absent transfer thereof into said storage locations.

2. The memory device as recited in claim 1, further comprising a first and second plurality of half-latches, $L1_0 \ldots L1_{N-1}$, and $L2_0 \ldots L2_{N-1}$, such that each scan cell $S_n$ in the plurality of scan cells $S_0 \ldots S_{N-1}$ is formed from the series-connected pair of half-latches $L1_n$ and $L2_n$.

3. The memory device as recited in claim 2, further comprising a functional mode of operation, in which the plurality of input signals $I_0 \ldots I_{N-1}$ are coupled through respective half-latches $L1_0 \ldots L1_{N-1}$ to respective outputs $O_0 \ldots O_{N-1}$, and do not traverse respective half-latches $L2_0 \ldots L2_{N-1}$.

4. The memory device as recited in claim 3, wherein outputs $O_0 \ldots O_{N-1}$ are adapted to select, write data to, read data from, or control the operation of storage locations within the memory.

5. The memory as recited in claim 2, wherein during the test mode of operation, the plurality of scan cells $S_0 \ldots S_{N-1}$ is configured such that a scan input signal SI is coupled to the input of scan cell $S_0$, the output of each scan cell $S_{n-1}$ is coupled to the input of scan cell $S_n$ (for $1 \leq n \leq N-1$), and the output of scan cell $S_{N-1}$ drives a scan output signal SO.

6. The memory device as recited in claim 5, wherein:
   if the memory is in the functional mode, half-latch $L1_n$ couples input signal $I_n$ to output $O_n$ (for $0 \leq n \leq N-1$); and
   if the memory is in the test mode, $L1_0$ couples SI to the input of $L2_0$, $L1_n$ couples the output of $L2_{n-1}$ to the input of $L2_n$, (for $1 \leq n \leq N-1$), and $L2_{N-1}$ couples the output of $L1_{N-1}$ to SO.

7. The memory as recited in claim 6, further comprising a scan control signal SC, such that, if SC is inactive the memory operates in functional mode, and if SC is active the memory operates in test mode.

8. The memory as recited in claim 7, further comprising a plurality of multiplexers, $M_0 \ldots M_{N-1}$, wherein:
   if SC is inactive, $M_n$ couples $I_n$ to the input of $L1_n$ (for $0 \leq n \leq N-1$); and
   if SC is active, $M_0$ couples SI to the input of $L1_0$, and $M_n$ couples the output of $L2_{n-1}$ to the input of $L1_n$ (for $1 \leq n \leq N-1$).

9. The memory as recited in claim 6, wherein during test mode operation, the coupled pairs of half-latches function as a boundary scan register.

10. The memory as recited in claim 8, wherein half-latches $L1_0 \ldots L1_{N-1}$, $L2_0 \ldots L2_{N-1}$, and multiplexers $M_0 \ldots M_{N-1}$ are part of the core logic of the memory.

11. The memory as recited in claim 1, wherein the memory further comprises circuitry embedded within an integrated circuit.

12. The memory as recited in claim 11, wherein the integrated circuit comprises an application specific integrated circuit (ASIC).

13. The memory as recited in claim 1, further comprising a static random access memory (SRAM).

14. The memory as recited in claim 1, further comprising a content addressable memory (CAM).

15. The memory device as recited in claim 2, wherein each scan cell $S_n$ is created by the addition of a second half-latch $L2_n$ to a half-latch $L1_n$ already present within the memory.

16. A memory device, comprising:
   A plurality of scan cells configured to forward a respective plurality of input signals onto an array of storage locations during a first time period, and wherein the input signals are forwarded through only a portion of each of the scan cells during the first time period; and
   Said plurality of scan cells configured to forward a test vector through each of the plurality of scan cells coupled in series during a second time period.

17. The memory device as recited in claim 16, wherein the first time period corresponds to a functional mode of operation, and the second time period corresponds to a test mode of operation.

18. The memory device as recited in claim 16, wherein each of the plurality of scan cells comprises a series-connected pair of half-latches, such that the input signals are forwarded through only the first half-latch of the respective pair, and not the second.

19. A method for operating a memory device in a functional mode and a test mode, comprising:
   in the functional mode, storing each bit $I_n$ of an input word $I_0 \ldots I_{N-1}$ in a half-latch $L1_n$ from a first plurality of half-latches $L1_0 \ldots L1_{N-1}$, and driving each output $O_n$ of a plurality of outputs $O_0 \ldots O_{N-1}$ with the captured state of $I_n$; and
   in the test mode, storing a scan input signal SI in half-latch $L1_0$, storing the output of each $L1_n$ in half-latch $L2_n$ from a second plurality of half-latches $L2_0 \ldots L2_{N-1}$, storing the output of each $L2_{n-1}$ in $L1_n$ (for $1 \leq n \leq N-1$), and driving a scan output signal SO with the output of $L2_{N-1}$.

20. The method as recited in claim 19, further comprising detecting a scan control signal SC, such that, if SC is inactive the memory operates in the functional mode, and if SC is active the memory operates in the test mode.

21. The method as recited in claim 19, further comprising:
   if SC is inactive, using multiplexer $M_n$ from a plurality of multiplexers $M_0 \ldots M_{N-1}$ to couple $I_n$ to $L1_n$ (for $0 \leq n \leq N-1$); and
   if SC is active, using multiplexer $M_0$ to couple SI to $L1_0$, and using multiplexer $M_n$ to couple the output of $L2_{n-1}$ to $L1_n$ (for $1 \leq n \leq N-1$).

22. The method as recited in claim 19, wherein each pair of half-latches $L1_n$ and $L2_n$ comprise a boundary scan cell.

23. The method as recited in claim 22, wherein in the second mode of operation, the coupled boundary scan cells comprise a boundary scan register.

* * * * *